(12) United States Patent
Han et al.

(10) Patent No.: US 9,502,605 B2
(45) Date of Patent: Nov. 22, 2016

(54) METHOD OF FABRICATING SEMICONDUCTOR LIGHT EMITTING DEVICE

(71) Applicant: Samsung Electronics Co., Ltd., Suwon-si (KR)

(72) Inventors: Sang Heon Han, Suwon-si (KR); Dong Yul Lee, Yongin-si (KR);
(Continued)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/714,223

(22) Filed: May 15, 2015

(65) Prior Publication Data

US 2016/0099378 A1 Apr. 7, 2016

(30) Foreign Application Priority Data

Oct. 1, 2014 (KR) ........................ 10-2014-0132546

(51) Int. Cl.
*H01L 33/00* (2010.01)
*H01L 33/06* (2010.01)

(52) U.S. Cl.
CPC ............ *H01L 33/007* (2013.01); *H01L 33/06* (2013.01)

(58) Field of Classification Search
None
See application file for complete search history.

(56) References Cited

U.S. PATENT DOCUMENTS 6,162,656 A 12/2000 Kunisato et al.
6,372,608 B1 4/2002 Shimoda et al.
(Continued)

FOREIGN PATENT DOCUMENTS

JP 2005-244207 A 9/2005
JP 2007-036174 A 2/2007
(Continued)

OTHER PUBLICATIONS

Yong-Tae Moon, et al., "Growth-Temperature Dependent Property of GaN Barrier Layer and Its Effect on InGaN/GaN Multiple Quantum Well Light-Emitting Diodes," Journal of the Korean Physical Society, vol. 42, No. 4, pp. 557-561, Apr. 2003.

*Primary Examiner* — Jack Chen
(74) *Attorney, Agent, or Firm* — Muir Patent Law, PLLC

(57) ABSTRACT

A method of fabricating a semiconductor light emitting device includes forming a first conductivity type semiconductor layer, forming an active layer by alternately forming a plurality of quantum well layers and a plurality of quantum barrier layers on the first conductivity type semiconductor layer, and forming a second conductivity type semiconductor layer on the active layer. The plurality of quantum barrier layers include at least one first quantum barrier layer adjacent to the first conductivity type semiconductor layer and at least one second quantum barrier layer adjacent to the second conductivity type semiconductor layer. The forming of the active layer includes allowing the at least one first quantum barrier layer to be grown at a first temperature and allowing the at least one second quantum barrier layer to be grown at a second temperature lower than the first temperature.

4 Claims, 18 Drawing Sheets

X1-X1'

(72) Inventors: Seung Hyun Kim, Seoul (KR); Jang Mi Kim, Seoul (KR); Suk Ho Yoon, Seoul (KR); Sang Jun Lee, Suwon-si (KR)

(56) References Cited

U.S. PATENT DOCUMENTS

| | | |
|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,304,793 B2 | 11/2012 | Yoshizumi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2008/0048172 A1 | 2/2008 | Muraki et al. |
| 2011/0212560 A1 | 9/2011 | Sumitomo et al. |
| 2013/0126898 A1 | 5/2013 | Kato et al. |
| 2013/0146840 A1 | 6/2013 | Han et al. |
| 2014/0034978 A1 | 2/2014 | Kimura et al. |
| 2016/0056331 A1* | 2/2016 | Kim .................. H01L 33/06 257/13 |
| 2016/0099378 A1* | 4/2016 | Han .................. H01L 33/0075 438/47 |

FOREIGN PATENT DOCUMENTS

| | | |
|---|---|---|
| JP | 2010-010444 A | 1/2010 |
| JP | 2010-123920 A | 6/2010 |
| JP | 5353821 B2 | 11/2013 |
| JP | 5383876 B1 | 1/2014 |

\* cited by examiner

METHOD OF FABRICATING SEMICONDUCTOR LIGHT EMITTING DEVICE

CROSS-REFERENCE TO RELATED APPLICATION

This application claims priority under 35 U.S.C. §119 to Korean Patent Application No. 10-2014-0132546, filed on Oct. 1, 2014, with the Korean Intellectual Property Office, the entire disclosure of which is incorporated herein by reference.

BACKGROUND

The present disclosure relates to a method of fabricating a semiconductor light emitting device.

Semiconductor light emitting devices are semiconductor devices capable of generating light in a specific wavelength band through recombination of electrons and holes. Compared to filament-based light sources, such semiconductor light emitting devices have favorable characteristics such as a relatively long lifespans, low power consumption, excellent initial operating characteristics, and the like. Hence, demand for semiconductor light emitting devices is continuously increasing. In particular, a group III nitride semiconductor capable of emitting light having a wavelength within a short-wavelength region of the electromagnetic spectrum has recently come to prominence.

At the time of the growth of a barrier layer within an active layer in a semiconductor light emitting device, the growth thereof may be performed at a relatively high temperature in consideration of crystalline properties such as a point defect and the like. On the other hand, a quantum well layer is generally required to be grown at a low temperature, and for example, when a high-temperature barrier layer is grown in the case of such quantum well layer growth, thermal damage thereto may occur. In particular, in a case in which a quantum well layer contains an element having a high degree of volatile characteristics, such as indium, the quantum well layer may be degraded due to the volatility of indium during a high temperature process of the quantum barrier layer or light emission efficiency may be significantly decreased due to degradation of interface characteristics.

SUMMARY

Some embodiments in the present disclosure may provide a method of fabricating a semiconductor light emitting device, in which deterioration in light emission efficiency due to thermal damage to a quantum well layer during a growth process of an active layer may be significantly reduced.

According an exemplary embodiment in the present disclosure, a method of fabricating a semiconductor light emitting device may include forming a first conductivity type semiconductor layer, forming an active layer having a plurality of quantum well layers and a plurality of quantum barrier layers alternately stacked on the first conductivity type semiconductor layer, and forming a second conductivity type semiconductor layer on the active layer. The plurality of quantum barrier layers may include at least one first quantum barrier layer adjacent to the first conductivity type semiconductor layer and at least one second quantum barrier layer adjacent to the second conductivity type semiconductor layer. The forming of the active layer may include growing the at least one first quantum barrier layer at a first temperature and growing the at least one second quantum barrier layer at a second temperature lower than the first temperature.

The plurality of quantum well layers may include at least one first quantum well layer adjacent to the first conductivity type semiconductor layer and at least one second quantum well layer adjacent to the second conductivity type semiconductor layer, and the at least one first quantum well layer may have a band gap profile different from that of the at least one second quantum well layer.

The plurality of quantum well layers may be nitride layers satisfying $In_{x1}Ga_{1-x1}N$, and the plurality of quantum barrier layers may be nitride layers satisfying $In_{x2}Al_{y2}Ga_{1-x2-y2}N$, where $0 \leq x_2 < x_1 < 1$, and $0 \leq y_2 < 1$.

The at least one first quantum well layer may have an indium composition ratio lower than that of the at least one second quantum well layer.

In this case, a change rate in indium composition ratios between the first quantum well layer and the first quantum barrier layer adjacent to each other may be lower than that in indium composition ratios between the second quantum well layer and the second quantum barrier layer adjacent to each other.

The at least one first quantum well layer may have a thickness less than that of the at least one second quantum well layer.

A thickness difference between the at least one first quantum well layer and the at least one second quantum well layer may be within 10% of the thickness of the at least one second quantum well layer.

In this case, the at least one first quantum well layer may have an indium composition ratio lower than that of the at least one second quantum well layer.

A wavelength of light emitted by the active layer may be determined by a wavelength of light emitted by the at least one second quantum well layer. The first temperature and the second temperature may have a temperature difference of 3 to 600° C. When the temperature difference between the first temperature and the second temperature is 600° C. or more, warpage of a wafer may be increased, and when the temperature difference between the first temperature and the second temperature is less than 3° C., it may be difficult to obtain a growth temperature control effect. The first temperature and the second temperature may be respectively selected from a range of 700 to 1300° C.

The number of the first quantum barrier layers and the number of the second quantum barrier layers may be different from each other.

The plurality of quantum barrier layers further include at least one third quantum barrier layer disposed between the first quantum barrier layer and the second quantum barrier layer, and the forming of the active layer may include growing the least one third quantum barrier layer at a third temperature lower than the first temperature and higher than the second temperature, to be disposed between the first quantum barrier layer and the second quantum barrier layer.

The active layer may further include a cap layer disposed between the quantum well layer and the quantum barrier layer adjacent to each other. In this case, at least a portion of the cap layer may have substantially the same composition as that of the quantum barrier layer adjacent thereto and may be grown at a temperature substantially identical to a growth temperature of the quantum well layer adjacent thereto.

According to an exemplary embodiment in the present disclosure, a method of fabricating a semiconductor light emitting device may include forming a first conductivity type nitride semiconductor layer, forming an active layer on the first conductivity type nitride semiconductor layer, and forming a second conductivity type nitride semiconductor layer on the active layer. The active layer may have a structure in which a plurality of quantum barrier layers and a plurality of quantum well layers containing indium are alternately stacked. The plurality of quantum barrier layers and the plurality of quantum well layers may be divided into a plurality of groups according to a growth direction, and the plurality of groups may respectively have at least one quantum barrier layer and at least one quantum well layer and may include a first group adjacent to the first conductivity type nitride semiconductor layer and a second group adjacent to the second conductivity type nitride semiconductor layer. A quantum barrier layer of the first group may be grown at a temperature higher than a growth temperature of a quantum barrier layer of the second group, and a quantum well layer of the first group may have an indium composition ratio lower than that of a quantum well layer of the second group.

A growth temperature of the quantum well layer of the first group may be higher than that of the quantum well layer of the second group.

A region of the quantum well layer of the first group in which an indium composition ratio thereof is highest may have a width less than that of a region of the quantum well layer of the second group in which an indium composition ratio thereof is highest. In this case, a change rate in indium composition ratios between the quantum well layer and the quantum barrier layer adjacent to each other in the first group may be lower than that in indium composition ratios between the quantum well layer and the quantum barrier layer adjacent to each other in the second group.

The plurality of groups may include a third group disposed between the first group and the second group, and a quantum barrier layer of the third group may be grown at a temperature different from those of quantum barrier layers of the first and second groups.

In this case, the quantum barrier layer of the third group may be grown at a temperature lower than a growth temperature of the quantum barrier layer of the first group and higher than a growth temperature of the quantum barrier layer of the second group. A quantum well layer of the third group may have an indium composition ratio higher than that of a quantum well layer of the first group and lower than that of a quantum well layer of the second group.

The second conductivity type nitride semiconductor layer may include an electron blocking layer disposed to be adjacent to the active layer and having a band gap greater than that of the quantum barrier layer of the second group.

According to an exemplary embodiment in the present disclosure, a light emitting module may include a circuit board having a first electrode structure and a second electrode structure, and the semiconductor light emitting device described above, mounted on the circuit board. The first electrode structure and the second electrode structure may be connected to a first electrode and a second electrode of the semiconductor light emitting device, respectively.

According to an exemplary embodiment in the present disclosure, a lighting apparatus may include a light emitting module including the semiconductor light emitting device described above, a driving unit configured to drive the light emitting module, and an external connection unit configured to supply an external voltage to the driving unit.

According to an exemplary embodiment in the present disclosure, a method of fabricating a semiconductor light emitting device may include steps of forming a first conductivity type semiconductor layer, forming an active layer on the first conductivity type semiconductor layer, and forming a second conductivity type semiconductor layer on the active layer. The step of forming the active layer may include forming, at a first temperature, a first quantum barrier layer on the first conductivity type semiconductor layer, forming, at a third temperature, a first quantum well layer on the first quantum barrier layer, and forming, at a second temperature lower than the first temperature and higher than the third temperature, a second quantum barrier layer on the first quantum well layer.

A first level of a gallium source gas supplied to form the first and second quantum barrier layers may be greater than a second level of the gallium source gas supplied to form the first quantum well layer.

The step of forming the active layer may further include forming a cap layer between the first quantum barrier layer and the first quantum well layer or between the first quantum well layer and the second quantum barrier layer, at a temperature substantially identical to the third temperature in a period during which the gallium source gas is supplied at the first level.

The first temperature and the second temperature may have a temperature difference of 3° C. to 600° C.

The first temperature and the second temperature may be respectively within a range of 700° C. to 1300° C.

The step of forming the active layer may further include: after the step of forming the second quantum barrier layer and before the step of forming the second conductivity type semiconductor layer, forming a second quantum well layer.

The first quantum well layer may have a thickness less than that of the second quantum well layer.

A band gap profile of the first quantum well layer may be different from a band gap profile of the second quantum well layer.

The second quantum well layer may be formed at a fourth temperature lower than the third temperature.

The first quantum well layer may have an indium composition ratio lower than that of the second quantum well layer.

A change rate in indium composition ratios between the first quantum well layer and the first quantum barrier layer may be lower than that in indium composition ratios between the second quantum well layer and the second quantum barrier layer.

The step of forming the active layer may further include: after the step of forming the second quantum well layer and before the step of forming the second conductivity type semiconductor layer, forming, at a temperature lower than the second temperature and higher than the third temperature, a third quantum barrier layer on the second quantum well layer, and forming a third quantum well layer on the third quantum barrier layer.

The second quantum well layer may have an indium composition ratio higher than that of the first quantum well layer and lower than that of the third quantum well layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
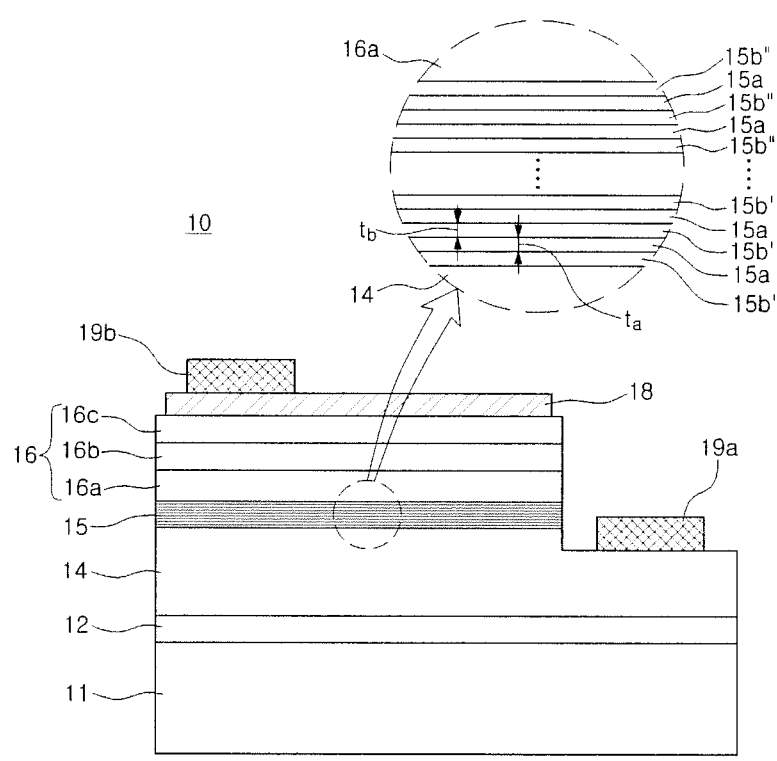
FIG. 1 is a side cross-sectional view of a semiconductor light emitting device according to an exemplary embodiment in the present disclosure.

Embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements. Unless explicitly described otherwise, the terms 'on', 'upper part', 'upper surface', 'lower part', 'lower surface', 'upward', 'downward', 'side surface', and the like will be used, based on the drawings, and may be changed depending on a direction in which a device or a constituent element is actually disposed.

FIG. 1 is a side cross-sectional view of a semiconductor light emitting device according to an exemplary embodiment in the present disclosure.

As illustrated in FIG. 1, a semiconductor light emitting device 10 according to an exemplary embodiment in the present disclosure may include a substrate 11, a first conductivity type semiconductor layer 14, an active layer 15, and a second conductivity type semiconductor layer 16 sequentially disposed on the substrate 11. The semiconductor light emitting device 10 may further include a buffer layer 12 disposed between the substrate 11 and the first conductivity type semiconductor layer 14.

The buffer layer 12 may be provided as an $In_xAl_yGa_{1-x-y}N$ ($0 \leq x \leq 1$, $0 \leq y \leq 1$) layer. For example, the buffer layer may be provided as an AlN layer, an AlGaN layer, or an InGaN layer. In addition, the buffer layer may be formed by combining a plurality of layers with each other or gradually changing a composition thereof as needed.

The substrate 11 according to the exemplary embodiment in the present disclosure may be provided as an insulating substrate such as a sapphire substrate, but is not limited thereto. The substrate 11 may be a conductive substrate or a semiconductor substrate, besides the insulating substrate. For example, the substrate 11 may be a SiC, Si, $MgAl_2O_4$, MgO, $LiAlO_2$, $LiGaO_2$ or GaN substrate in addition to a sapphire substrate.

The first conductivity type semiconductor layer 14 may be a nitride semiconductor layer satisfying an n-type $In_xAl_yGa_{1-x-y}N$ layer ($0 \leq x < 1$, $0 \leq y < 1$, $0 \leq x+y < 1$), and here, as an n-type impurity, silicon (Si) may be used. For example, the first conductivity type semiconductor layer 14 may contain n-type GaN. The second conductivity type semiconductor layer 16 may be a nitride semiconductor layer satisfying p-type $In_xAl_yGa_{1-x-y}N$ ($0 \leq x < 1$, $0 \leq y < 1$, $0 \leq x+y < 1$), and as a p-type impurity thereof, Mg may be used. For example, the second conductivity type semiconductor layer 16 may be implemented to have a single layer structure, but may have a multilayer structure having different compositions as needed. As illustrated in FIG. 1, the second conductivity type semiconductor layer 16 may include a p-type AlGaN layer 16a provided as an electron blocking layer (EBL), a low concentration p-type GaN layer 16b, and a high concentration p-type GaN layer 16c.

The active layer 15 may have a multiple quantum well (MQW) structure in which a quantum well layer 15a and a quantum barrier layer 15b' or 15b" are alternately stacked. For example, the quantum well layer 15a and the quantum barrier layer 15b' or 15b" may be $In_xAl_yGa_{1-x-y}N$ layers ($0 \le x \le 1$, $0 \le y \le 1$, $0 \le x+y \le 1$) having different compositions. The quantum well layer 15a may contain an element having a relatively high degree of volatility, such as indium (In). In further detail, the quantum well layer 15a may be an $In_xGa_{1-x}N$ ($0 < x \le 1$) layer, and the quantum barrier layers 15b' and 15b" may be a GaN layer or an AlGaN layer.

The quantum barrier layers 15' and 15b" employed in the present exemplary embodiment of the present disclosure may be classified as a first quantum barrier layer 15b' and a second quantum barrier layer 15b" according to a growth direction. The first and second quantum barrier layers 15b' and 15b" are illustrated as a plurality of layers, but are not limited to the number thereof. For example, at least one of the first and second quantum barrier layers 15b' and 15b" may be configured as a single layer.

Figure 2:
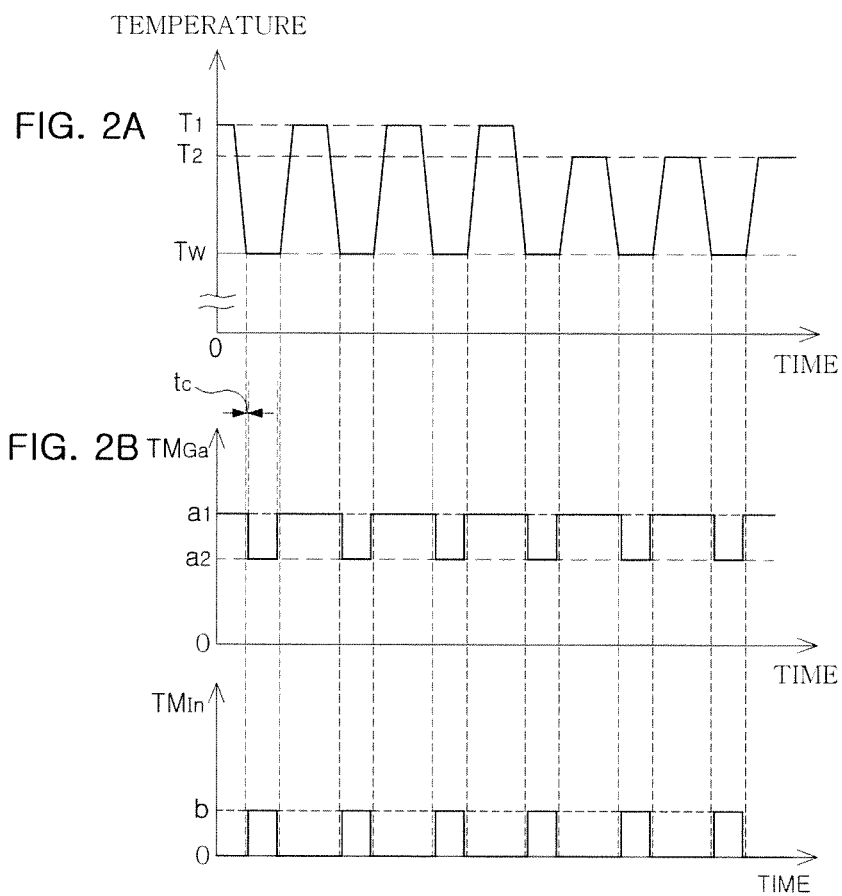
FIGS. 2A and 2B are time charts respectively illustrating a growth temperature and principal source gas in a growth process of an active layer employable in an exemplary embodiment of the present disclosure.

In the present exemplary embodiment of the present disclosure, the first and second quantum barrier layers 15b' and 15b" may be grown at different growth temperatures. FIGS. 2A and 2B are time charts respectively illustrating a growth temperature and principal source gas in a growth process of an active layer 15 employable in an exemplary embodiment of the present disclosure.

With reference to FIG. 2A, the first quantum barrier layer 15b' may be grown at a first temperature T1, and the second quantum barrier layer 15b" may be grown at a second temperature T2 lower than the first temperature T1. The quantum well layer 15a may be grown at a temperature Tw lower than the first and second temperatures T1 and T2.

On the other hand, as illustrated in FIG. 2B, in a growth process of the first and second quantum barrier layers 15b' and 15b", a GaN thin film may be formed by supplying TMGa as a gallium source gas, in a predetermined level (a1), along with a nitrogen source gas such as $NH_3$, and in a growth process of the quantum well layer 15a, compared to the supply levels of the first and second quantum barrier layers 15b' and 15b", a supply level of TMGa, the gallium source gas, may be reduced (a change of a1 to a2), and an indium source gas, TMIn may be additionally supplied in a predetermined level (b), to thus form an InGaN thin film as required.

As illustrated in FIGS. 2A and 2B, the first quantum barrier layer 15b' may be formed under conditions similar to those of the second quantum barrier layer 15b" except that only a growth temperature thereof is relatively high. Since the first quantum barrier layer 15b' is grown at a relatively high temperature, the first quantum barrier layer may have a more excellent degree of crystalline properties than that of the second quantum barrier layer 15b". On the other hand, the high growth temperature of the first quantum barrier layer 15b' may impose thermal damage on the quantum well layer 15a containing indium having a relatively high degree of volatility. For example, in a case in which a quantum barrier layer is formed at a relatively high temperature, some indium incorporated in a pre-formed quantum well layer may be volatilized, resulting in the occurrence of a point defect and a deterioration of interface roughness. Thus, an amount of point defects at an interface between the first quantum barrier layer 15b' and the quantum well layer 15a may be greater than that of point defects at an interface between the second quantum barrier layer 15b" and the quantum well layer 15a.

In consideration of such a problem, a cap layer may be interposed between the quantum barrier layer 15b' or 15b" and the quantum well layer 15a. As illustrated in FIGS. 2A and 2B, the cap layer may be grown at a temperature substantially identical to a growth temperature Tw of the quantum well layer adjacent thereto in a period tc during which a source gas is supplied to allow the cap layer to have substantially the same composition as that of the quantum barrier layer 15b' or 15b" adjacent thereto. In detail, the cap layer may be formed via switching to a source gas to form a quantum barrier layer before lowering a temperature to a growth temperature of a quantum well layer and starting a process to allow for growth conditions of the quantum well layer and switching to allow the source gas to be supplied to form a quantum barrier layer before growth at a growth temperature of the quantum barrier layer. As such, at least a portion of the cap layer may be disposed at the front and rear of the quantum well layer. However, in a case in which a thickness of such a cap layer is excessively increased, for example, proportionally to tc, a defect may occur in the cap layer or a problem such as an increase in an operating voltage may occur.

According to exemplary embodiments in the present disclosure, a scheme in which the second quantum barrier layer 15b" disposed to be adjacent to the second conductivity-type semiconductor layer 16 is formed at the second temperature T2 lower than the first temperature T1 may be proposed. As such, a lower region of an active layer in an initial growth process may be grown at a relatively high temperature to secure crystalline properties, and in an upper region of the active layer in a latter growth process, the quantum barrier layer may be grown at a relatively low temperature so that thermal damage to the quantum well layer actually contributing to emission of light, for example, a quantum well layer adjacent to the second conductivity type semiconductor layer, may be significantly reduced to improve light emission efficiency. By such a scheme, a thickness of the cap layer may be significantly reduced even in a case in which the cap layer is not additionally formed or is additionally formed. In the exemplary embodiment of the present disclosure, for example, the thickness of the cap layer may be around 1 mm or less.

The growth temperature Tw of the quantum well layer 15a may be changed depending on an indium composition ratio. For example, as the Indium composition ratio is increased, the quantum well layer may be grown at a relatively low temperature. For example, the growth temperature Tw of the quantum well layer 15a may be 900° C. or less, in detail, 850° C. or less. The growth temperatures of the first and second quantum barrier layers 15b' and 15b" may be higher than that of the quantum well layer 15a, and for example, the first and second temperatures T1 and T2 may respectively be within a range of 700 to 1300° C. The second temperature T2 may be selected as a condition in which thermal damage to the quantum well layer 15a employed in the exemplary embodiment of the present disclosure may be significantly reduced.

On the other hand, the first temperature T1 may be selected as a condition for securing excellent crystalline properties of the first quantum barrier layer 15b'. The first temperature T1 and the second temperature T2 may have a temperature difference of at least 5° C. therebetween, but are not limited thereto. For example, a difference between the first temperature T1 and the second temperature T2 may be within a range of 3 to 600° C. In a case in which the temperature difference therebetween is 600° C. or more, warpage of a wafer may be increased, and in a case in which the temperature difference is less than 3° C., it may be difficult to obtain growth temperature adjustment effects. In a detailed example, a difference between the first temperature T1 and the second temperature T2 may also be within a range of 5 to 70° C.

The semiconductor light emitting device 10 may include a first electrode 19a disposed on the first conductivity type semiconductor layer 14, and an ohmic contact layer 18 and a second electrode 19b sequentially disposed on the second conductivity type semiconductor layer 16.

The first electrode 19a and the ohmic contact layer 18 may contain a material such as Ag, Ni, Al, Rh, Pd, Ir, Ru, Mg, Zn, Pt, Au, or the like, and may have a structure of a single layer or two or more layers, but are not limited thereto. The first electrode 19a may contain Cr/Au serving as a contact electrode layer. The first electrode 19a may further include a pad electrode layer on the contact electrode layer. The pad electrode layer may be provided as an Au layer, a Sn layer or an Au/Sn layer.

The ohmic contact layer 18 may be variously implemented. For example, in the case of a flip-chip structure, the ohmic contact layer 18 may contain Ag. In the case that the ohmic contact layer 18 is inversely disposed, the ohmic contact layer 18 may be configured of a light transmitting electrode. The light transmitting electrode may be provided as one of a transparent conductive oxide layer or nitride layer. For example, the light transmitting electrode may include one or more selected from indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and $Zn_{(1-x)}Mg_xO$ (Zinc Magnesium Oxide, $0 \leq x \leq 1$). The ohmic contact layer 18 may also contain graphene as needed. The second electrode 19b may contain Au, Sn or Au/Sn.

In an exemplary embodiment of the present disclosure illustrated with reference to FIGS. 2A and 2B, although the quantum well layers are illustrated as being formed in a single process condition, in a manner different therefrom, the quantum well layers may be formed under different process conditions. In detail, by allowing different indium composition ratios to be applied thereto, thermal damage applied to the quantum well layer at the time of forming the first quantum barrier layer may be significantly reduced.

Figure 3:
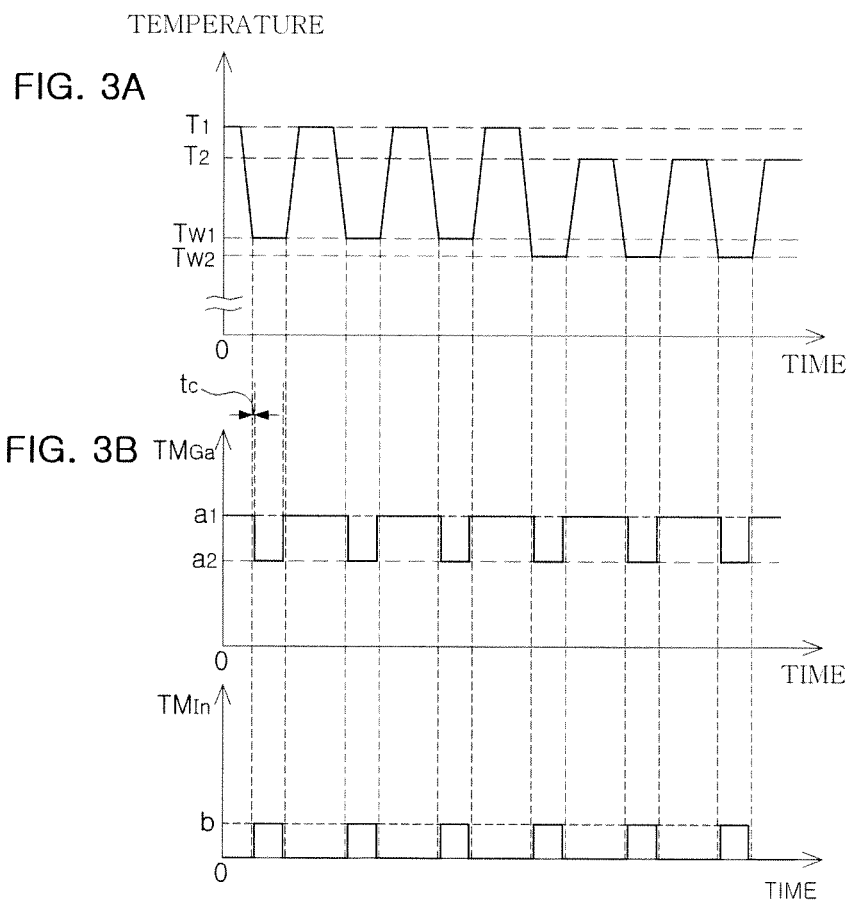
FIGS. 3A and 3B are time charts respectively illustrating a growth temperature and principal source gas in a growth process of an active layer employable in another exemplary embodiment of the present disclosure.

FIGS. 3A and 35 are time charts respectively illustrating a growth temperature and principal source gas in a growth process of an active layer employable in another exemplary embodiment of the present disclosure.

As illustrated in FIG. 3B, the source gas in the exemplary embodiment of the present disclosure may be supplied substantially identically as illustrated in the time chart of FIG. 2B. In other words, in a growth process of the first and second quantum barrier layers, a GaN thin film may be formed by supplying a nitrogen source gas such as $NH_3$, and TMGa, a gallium source gas, in a predetermined level (a1), and in a growth process of the quantum well layer, compared to the supply levels of the first and second quantum barrier layers, a supply level of TMGa, the gallium source gas, may be reduced (a change of a1 to a2), and an indium source gas, TMIn may be additionally supplied in a predetermined level (b), to thus form an InGaN thin film as required.

In addition, with reference to FIG. 3A, in the case of a growth temperature of a quantum barrier layer, a first quantum barrier layer may be grown at a first temperature T1 and a second quantum barrier layer may be grown at a second temperature T2 lower than the first temperature T1, similarly to the cases of the exemplary embodiment with reference to FIGS. 2A and 2B.

However, in the exemplary embodiment of the present disclosure, a different growth temperature may be used. In detail, as illustrated in FIG. 3A, three quantum well layers (hereinafter, referred to as a 'first quantum well layer') relevant to the first quantum barrier layer may be grown at a relatively high temperature $T_{w1}$, and three quantum well layers (hereinafter, referred to as a 'second quantum well layer') relevant to the second quantum barrier layer may be grown at a relatively low temperature $T_{w2}$.

Under the same source gas supply condition, since the first quantum well layer is grown at a temperature higher than a growth temperature of the second quantum well layer, the content of indium having a relatively high degree of volatility in the first quantum well layer may be relatively low. As such, since the indium composition ratio of the first quantum well layer is lower than that of the second quantum well layer, thermal damage, for example, a dot defect or the like, to the first quantum well layer may be significantly reduced as compared with thermal damage occurring in the second quantum well layer, even in the case of exposure thereof to the high temperature T1 applied to a growth process of the first quantum barrier layer. Such improvements in crystalline properties may have a positive influence on subsequent crystal growth.

Figure 4:
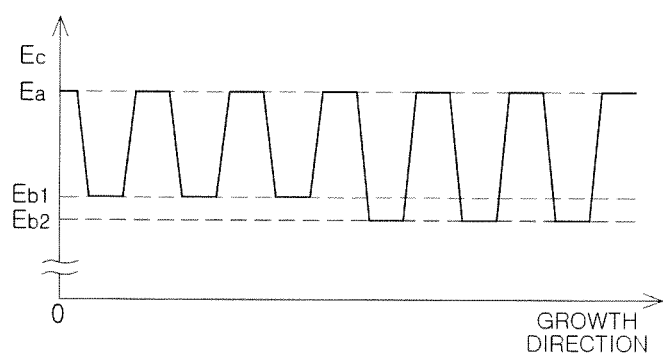
FIG. 4 is an energy band (a conduction band) diagram of an active layer employable in an exemplary embodiment of the present disclosure.

An active layer obtained through the process, based on the time charts illustrated in FIGS. 3A and 3B, may have a conduction band represented by an energy band diagram illustrated in FIG. 4.

With reference to FIG. 4, respective quantum barrier layers may have substantially the same band gap, and on the other hand, the first quantum well layer may have a band gap greater than that of the second quantum well layer. For example, when the first and second conductivity type semiconductor layers are respectively an n-type semiconductor layer and a p-type semiconductor layer, since hole mobility is lower than electron mobility, the second quantum well layer may be provided as a principal light emission region, and a band gap difference of the first quantum well layer may not significantly influence a light emission wavelength of the entirety of the active layer.

As such, the second quantum well layer may be provided as a principal light emission region which is a quantum well layer adjacent to the second conductivity type semiconductor layer, and thus, as growth conditions of the second quantum well layer, such as source gas supply, temperature, and the like, an indium composition ratio may be set in consideration of a light emission wavelength required by a final semiconductor light emitting device. In a manner different therefrom, even in a case in which the first quantum well layer is formed to have a relatively low indium composition ratio, since a degree of contribution thereof to a light emission amount is relatively low, there may be little negative influence thereon.

In the exemplary embodiment of the present disclosure, although the adjustment of an indium composition ratio has been illustrated as the example using a growth temperature of the quantum well layer, a method of reducing a flow rate of an indium source gas may be used. In addition, an indium composition ratio adjusting method of the first and second quantum well layers according to the exemplary embodiment in the present disclosure may be advantageously applied to a growth process of an active layer of the semiconductor light emitting device illustrated in FIG. 1.

Figure 5:
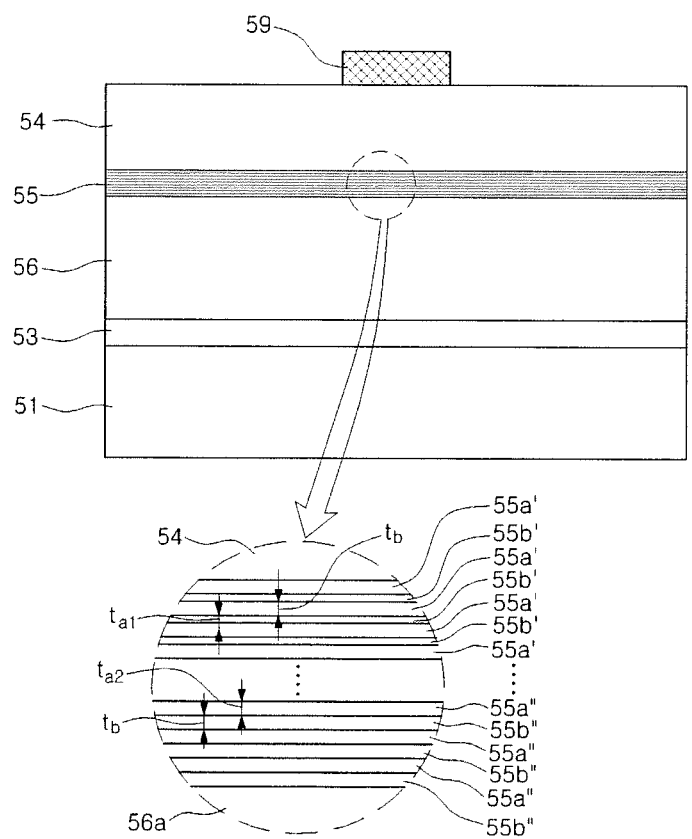
FIG. 5 is a side cross-sectional view of a semiconductor light emitting device according to an exemplary embodiment in the present disclosure.

The exemplary embodiments in the present disclosure may be appropriately used for semiconductor light emitting devices having various structures in addition to a semiconductor light emitting device illustrated in FIG. 1. FIG. 5 is a side cross-sectional view of a semiconductor light emitting device having a vertical structure according to an exemplary embodiment in the present disclosure.

As illustrated in FIG. 5, a semiconductor light emitting device 50 according to an exemplary embodiment in the present disclosure may include a conductive substrate 51, and a second conductivity type semiconductor layer 56, an active layer 55, and a first conductivity type semiconductor layer 54 sequentially disposed on the conductive substrate 51.

A metal bonding layer 53 may be disposed between the conductive substrate 51 and the first conductivity type semiconductor layer 54. The metal bonding layer 53 employed in the exemplary embodiment of the present disclosure may include an ohmic contact material. The conductive substrate 51 and an electrode 59 disposed on the first conductivity type semiconductor layer 54 may be used as electrodes driving the semiconductor light emitting device. Such an electrode arrangement may allow a current to flow in a vertical direction.

The second conductivity type semiconductor layer 56, the active layer 55, and the first conductivity type semiconductor layer 54 may be understood as having a form in which growth thereof is conducted on a different growth substrate, a transfer thereof to the conductive substrate 51 is undertaken, and the growth substrate is removed. As in the foregoing exemplary embodiments of the present disclosure, the first and second conductivity type semiconductor layers 54 and 56 may be nitride semiconductor layers respectively represented by n-type and p-type $In_xAl_yGa_{1-x-y}N$ ($0 \le x < 1$, $0 \le y < 1$, $0 \le x+y < 1$). The second conductivity type semiconductor layer 56 may include a p-type AlGaN layer provided as an electron blocking layer (EBL) and a p-type GaN layer provided as a contact layer. The active layer 55 may have a multiple quantum well (MQW) structure in which a quantum well layer 55a' or 55a'' and a quantum barrier layer 55b' or 55b'' are alternately stacked. For example, the quantum well layer 55a' or 55a'' and the quantum barrier layer 55b' or 55b'' may be $In_xAl_yGa_{1-x-y}N$ ($0 \le x \le 1$, $0 \le y \le 1$, $0 \le x+y \le 1$) layers having different compositions.

The quantum well layers 55a' and 55a'' may contain an element having a relatively high degree of volatility, such as indium (In). The quantum barrier layers 55b' and 55b'' may be, for example, GaN layers, nitride layers having an indium composition ratio lower than that of the quantum well layers 55a' and 55a''.

Figure 6A:
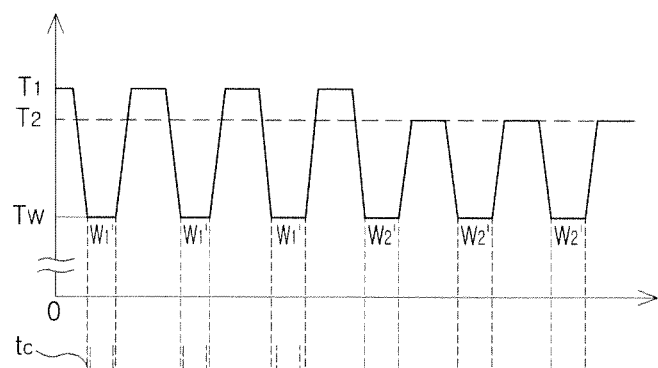
FIGS. 6A and 6B are time charts illustrating a growth temperature and principal source gas in a growth process of an active layer employed in an exemplary embodiment in the present disclosure.

Similar to the foregoing exemplary embodiments in the present disclosure, as illustrated in FIG. 6A, a first quantum barrier layer 55b' adjacent to the first conductivity type semiconductor layer 54 may be grown at a first temperature T1, and a second quantum barrier layer 55b'' adjacent to the second conductivity type semiconductor layer 56 may be grown at a second temperature T2 lower than the first temperature T1. Since the semiconductor light emitting device 50 according to the exemplary embodiment in the present disclosure has a structure in which an epitaxial layer is grown and then transferred to the conductive substrate 51, a stacking sequence on the conductive substrate and a growth sequence therefrom may be opposite to each other. Thus, the first quantum barrier layer 55b' grown prior to growth of the second quantum barrier layer 55b'' may be understood as being grown at a temperature higher than a growth temperature of the second quantum barrier layer 55b'' to be grown subsequently.

The first and second quantum well layers 55a' and 55a'' may be grown at a temperature Tw lower than the first and second temperatures T1 and T2.

In the exemplary embodiment of the present disclosure, the first and second quantum barrier layers 55b' and 55b'' may have a substantially equal thickness, for example, a thickness $t_b$, and on the other hand, the first and second quantum well layers 55a' and 55a'' may have different thicknesses $t_{a1}$ and $t_{a2}$. As illustrated in FIG. 5, the thickness $t_{a1}$ of the first quantum well layer 55a' may be less than that a thickness $t_{a2}$ of the second quantum well layer 55a''.

Figure 6B:
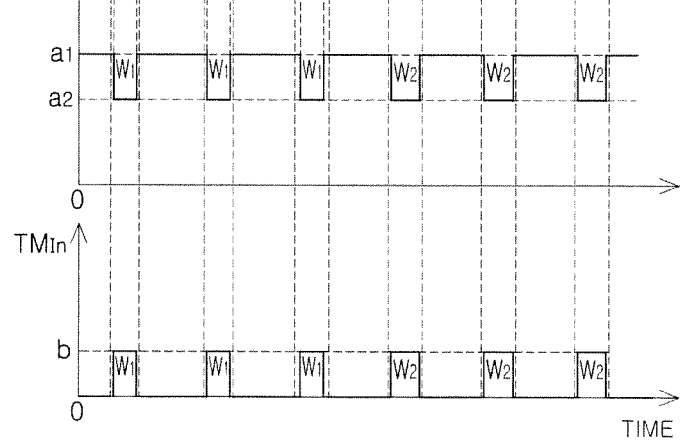

Such a thickness difference between the first and second quantum well layers 55a' and 55a'' may be obtained by differently setting temperature maintenance periods and source gas supply periods for the first and second quantum well layers 55a' and 55a'' to have a difference therebetween as illustrated in FIGS. 6A and 6B. For example, a required difference in thicknesses between the first and second quantum well layers 55a' and 55a'' may be secured by setting a Tw temperature maintenance period W1' and an In source gas supply period W1 corresponding to the first quantum well layer 55a' to be shorter than a Tw temperature maintenance period W2' and an In source gas supply period W2 corresponding to the second quantum well layer 55a''. A thickness difference between the first and the second quantum well layers is within 10% of the thickness of the second quantum well layer.

Figure 7:
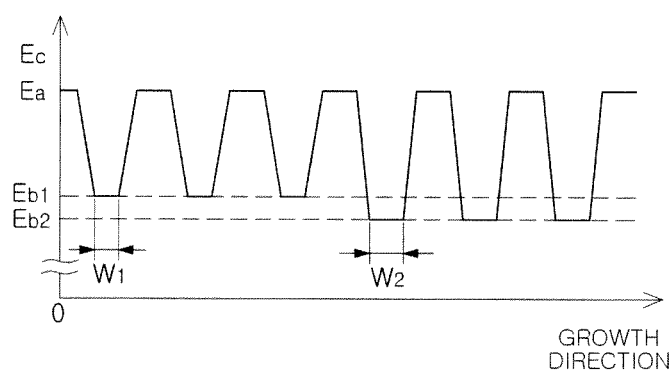
FIG. 7 is an energy band (a conduction band) diagram of an active layer employed in an exemplary embodiment in the present disclosure.

In detail, as illustrated in FIG. 7, the first and second quantum well layers 55a' and 55a'' may have band gaps $E_{b1}$ and $E_{b2}$ smaller than a band gap $E_a$ of the first and second quantum barrier layers 55b' and 55b''. A width $W_1$ of a region of the first quantum well layer 55a' (for example, a period in which an indium composition ratio is relatively highest) in which a band gap thereof is lowest ($E_{b1}$) in the first quantum well layer 55a' may be smaller than a width $W_2$ of a region of the second quantum well layer 55a'' in which a band gap thereof is relatively lowest ($E_{b2}$), and the lowest band gap $E_{b1}$ of the first quantum well layer 55a' may be greater than the lowest band gap $E_{b2}$ of the second quantum well layer 55a''. As such, the band gaps of the first and second quantum well layers 55a' and 55a'' may have different distributions.

Figure 8A:
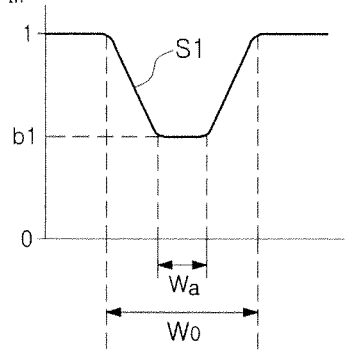
FIGS. 8A and 8B are graphs illustrating indium composition ratio distributions of first and second quantum well layers employed in an exemplary embodiment of the present disclosure.
Figure 8B:
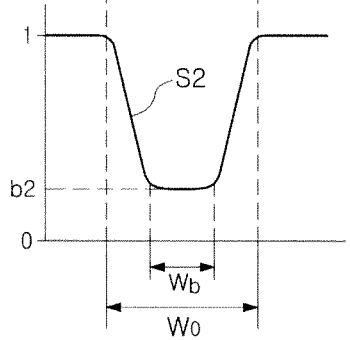

FIG. 8A illustrates an indium composition ratio distribution of the first quantum well layer 55a', and FIG. 8B illustrates an indium composition ratio distribution of the second quantum well layer 55a''.

When indium composition ratios of an active layer are measured by a secondary ion mass spectrometry analysis, the measurement result may actually be represented as a distribution difficult to readily discern a boundary between the quantum well layer and the quantum barrier layer as shown in FIGS. 8A and 8B.

For example, as illustrated in FIGS. 8A and 8B, although an InGaN quantum well layer having a specific composition is disposed between GaN quantum barrier layers, an indium composition distribution between the quantum well layer and the quantum barrier layer may have a predetermined gradient. In detail, as illustrated in FIG. 6B, even in a case in which an indium source gas is supplied at a predetermined flow rate to allow the quantum well layer to be grown, a predetermined change rate may be provided due to a delay of supply (i.e. start) and supply cut-off (i.e. stop) of indium in each period.

In such an indium composition ratio distribution, although thicknesses of the first quantum well layer 55a' and the second quantum well layer 55a'' may be defined as an overall indium supply period, a highest indium composition ratio region excepting a portion in which a predetermined change rate thereof is represented, may be represented as a reference thickness. For example, in FIG. 8A, a thickness of a highest indium composition ratio region of the first quantum well layer 55a' may be represented as "Wa", and in FIG. 8B, a thickness of a highest indium composition ratio region of the second quantum well layer 55a" may be represented as "Wb".

In addition, the first and second quantum well layers 55a' and 55a" may be discerned by a change rate in an indium composition ratio. For example, as an indium composition ratio change rate is decreased, an overall indium content of a corresponding quantum well layer may be decreased.

For example, when an indium composition ratio change rate S1 relevant to the first quantum well layer 55a' under the same condition in which intervals $W_0$ between adjacent quantum barrier layers are the same as each other is relatively low, since a thickness Wa of a region of the first quantum well layer 55a' in which the indium composition ratio thereof is highest is relatively decreased, an overall indium content of the first quantum well layer may be reduced. On the other hand, a change rate S2 of an indium composition ratio relevant to the second quantum well layer 55a" is relatively high, since a thickness Wb of a region of the second quantum well layer 55a" in which the indium composition ratio thereof is highest is relatively increased, the overall indium content of the second quantum well layer 55a" may be increased. As such, a relatively low indium content condition of the first quantum well layer 55a' may be represented by a change rate in indium composition ratios between a quantum well layer and a quantum barrier layer adjacent to each other.

Figure 9:
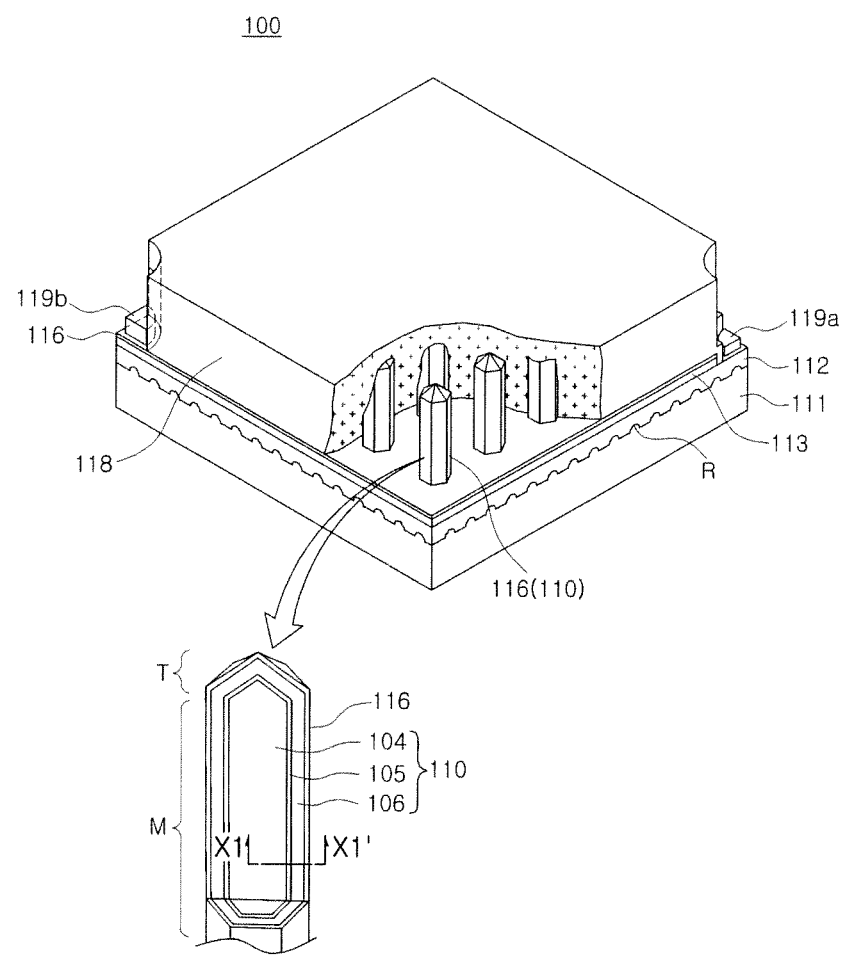
FIG. 9 is a schematic perspective view of a nanostructure semiconductor light emitting device according to an exemplary embodiment in the present disclosure.

FIG. 9 is a schematic perspective view of a nanostructure semiconductor light emitting device according to an exemplary embodiment in the present disclosure.

With reference to FIG. 9, a nanostructure semiconductor light emitting device 100 may include a base layer 112 formed using a first conductivity type semiconductor material, and a plurality of nano-light emitting structures 110 disposed thereon.

The nanostructure semiconductor light emitting device 100 may include a substrate 111 having an upper surface on which the base layer 112 is disposed. The upper surface of the substrate 111 may have a concave-convex portion R formed therein. The concave-convex portion R may allow for an improved quality of a single crystal grown thereon while improving light extraction efficiency. The substrate 111 may be an insulating substrate, a conductive substrate, or a semiconductor substrate. For example, the substrate 111 may be provided as a sapphire substrate, a SIC substrate, a Si substrate, a $MgAl_2O_4$ substrate, a MgO substrate, a $LiAlO_2$ substrate, a $LiGaO_2$ substrate, or a GaN substrate.

The base layer 112 may include a first conductivity type nitride semiconductor layer and may provide a growth surface of the nano-light emitting structure 110. The base layer 112 may be provided as a nitride semiconductor layer satisfying $In_xAl_yGa_{1-x-y}N$ ($0 \leq x<1$, $0 \leq y<1$, $0 \leq x+y<1$) and may be doped with an n-type impurity such as Si. For example, the base layer 112 may be an n-type GaN layer.

An insulating layer 113 having openings for growth of the nano-light emitting structures 110, in detail, nano cores 104 may be formed on the base layer 112. The nanocores 104 may be formed in regions of the base layer 112 exposed to the openings. The insulating layer 113 may be used as a mask for the growth of the nanocores 104. For example, the insulating layer 113 may be formed using an insulation material such as $SiO_2$ or $SiN_x$.

The nano-light emitting structures 110 may include a main portion M having a hexagonal prism shaped structure and an upper end portion T disposed on the main portion M. The main portion M of the nano-light emitting structure 110 may have lateral surfaces having the same crystalline surface, and the upper end portion T of the nano-light emitting structure 110 may have a crystal surface different from those of lateral surfaces of the nano-light emitting structure 110. The upper end portion T of the nano light emitting structure 110 may have a hexagonal pyramid shape. Such structures may actually be discerned by the nanocores 104, and the nanocore 104 may also be understood as being discerned by the main portion M and the upper end portion T thereof.

The nano-light emitting structure 110 may include a nanocore 104 configured of a first conductivity type nitride semiconductor, and an active layer 105 and a second conductivity type nitride semiconductor layer 106 sequentially disposed on a surface of the nanocore 104.

Figure 10:
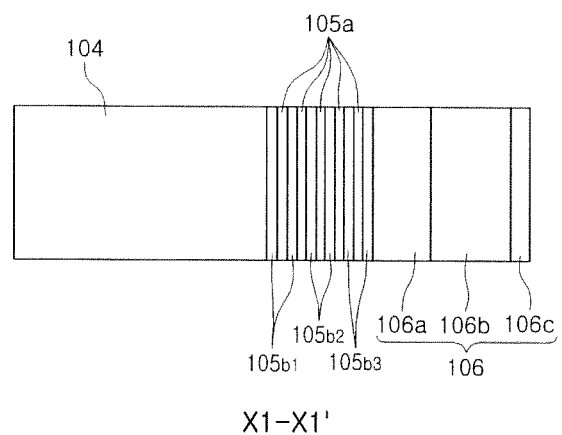
FIG. 10 is a schematic view illustrating a stacking structure of a nano light emitting structure illustrated in FIG. 9.

FIG. 10 is an enlarged view of a portion of a nano light emitting structure taken along line X1-X1 of FIG. 9.

The nanocore 104 may include a nitride semiconductor satisfying $In_xAl_yGa_{1-x-y}N$ ($0 \leq x<1$, $0 \leq y<1$, $0 \leq x+y<1$) similar to that of the base layer 112. For example, the nanocore 104 may be an n-type GaN layer.

The second conductivity type nitride semiconductor layer 106 may include a nitride semiconductor satisfying p-type $In_xAl_yGa_{1-x-y}N$ ($0 \leq x<1$, $0 \leq y<1$, $0 \leq x+y<1$). As in the exemplary embodiment of the present disclosure, the second conductivity nitride semiconductor layer 106 may include a p-type AlGaN layer 106a provided as an electron blocking layer (EBL), a low concentration p-type GaN layer 106b, and a high-concentration GaN layer 106c. The p-type AlGaN layer 106a and the high-concentration p-type GaN layer 106c may be provided as an electron blocking layer (EBL) and a contact layer, respectively.

As illustrated in FIG. 10, the active layer 105 employed in the exemplary embodiment of the present disclosure may have a multiple quantum well structure in which a plurality of quantum well layers 105a and a plurality of quantum barrier layers $105b_1$, $105b_2$ and $105b_3$ are alternately stacked. The plurality of quantum well layers 105a are nitride layers containing indium and may be configured of $In_{x1}Ga_{1-x1}N$ layers ($x_2<x_1<1$), and the plurality of quantum barrier layers $105b_1$, $105b_2$, and $105b_3$ may be configured of $In_{x2}Al_{y2}Ga_{1-x2-y2}N$ layers ($0 \leq x_2<x_1$, $0 \leq y_2<1$). For example, the quantum barrier layers $105b_1$, $105b_2$, and $105b_3$ may be provided as GaN layers or AlGaN layers. The plurality of quantum barrier layers may be configured of two or more groups according to a growth direction. As illustrated in FIG. 10, the quantum barrier layers may include a quantum barrier layer $105b_1$ of a first group, a quantum barrier layer $105b_2$ of a second group, and a quantum barrier layer $105b_3$ of a third group according to a growth direction.

Figure 11:
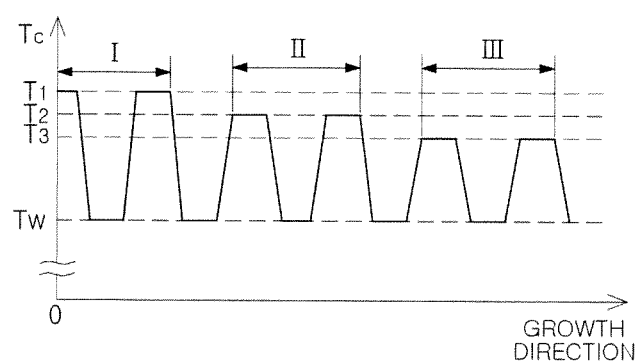
FIG. 11 is a growth temperature time chart illustrating a growth process of an active layer employed in an exemplary embodiment of the present disclosure.

As illustrated in FIG. 11, the quantum barrier layers of respective groups I, II and III may be grown under similar conditions in the case of growth conditions such as a source gas supply, pressure, and the like, except that only growth temperatures are different. The quantum barrier layer of the first group I may be grown at a relatively high temperature and may thus have relatively high crystallinity as compared to that of the quantum barrier layers of remaining groups II and III. In addition, since the quantum barrier layer of the third group III may be grown at a temperature lower than that of the quantum barrier layers of the other groups I and II, thermal damage to the quantum well layer relevant to the quantum barrier layer of the third group III may be significantly reduced. A quantum well layer of the second group II may have an indium composition ratio higher than that of a quantum well layer of the first group I and lower than that of a quantum well layer of the third group III.

As such, a problem in which deterioration of crystallinity such as a dot defect and the like due to volatility of indium in the quantum well layer adjacent to the second conductivity type nitride semiconductor layer 106 may be reduced, and an increase in a level of an operating voltage and degradation of light emission efficiency may be prevented.

The nanostructure semiconductor light emitting device 100 may include a contact electrode 116 connected to the second conductivity type nitride semiconductor layer 106. The contact electrode 116 employed in the exemplary embodiment of the present disclosure may be formed using a conductive material having light transmission properties. The contact electrode 116 may secure light emission toward the nano light emitting structure, for example, in a direction opposite to a direction toward the substrate. The contact electrode 116 may be formed using at least one of transparent electrode materials described as an example above.

The contact electrode 116 is not limited to a light transmitting material, and may have a reflective electrode structure as needed. The contact electrode 116 may be formed using a reflective electrode material such as Ag, and may be implemented to have a flip chip structure by employing such a reflective electrode structure therein.

An insulating protective layer 118 may be formed on upper surfaces of the nano light emitting structures 110. The insulating protective layer 118 may be a passivation portion protecting the nano light emitting structures 110. In addition, the insulating protective layer 118 may be formed of a material having light transmission properties so that light generated in the nano light emitting structures 110 may be extracted. In this case, the insulating protective layer 118 may be formed by selectively using a material having appropriate refractivity to improve light extraction efficiency.

As in the exemplary embodiment of the present disclosure, after the contact electrode 116 is formed, the insulating protective layer 118 may fill a space between the plurality of anno light emitting structures 110. In the insulating protective layer 118, an insulation material such as $SiO_2$ or $SiN_x$ may be used. For example, as a material of the insulating protective layer 118, a material such as TetraEthylOrthoSilane (TEOS), BoroPhospho Silicate Glass (BPSG), CVD-$SiO_2$, Spin-on Glass (SOG), or Spin-on Dielectric (SOD) may be used. The insulating protective layer 118 may be employed to fill a space between the nano light emitting structures 110, but is not limited thereto. For example, a space between the nano light emitting structures 110 may also be filled with an electrode element such as a contact electrode 116, for example, a reflective electrode material in another example.

The nano structure semiconductor light emitting device 100 may include first and second electrodes 119a and 119b. The first electrode 119a may be disposed in a portion of a region of the base layer 112, in which the base layer 112 configured of a first conductivity type semiconductor is partially exposed. In addition, the second electrode 119b may be disposed in a region of the contact electrode 116 extendedly exposed. The arrangement of the electrodes is not limited to the illustration above, and various arrangements of electrodes may be applied according to a use environment thereof.

The active layer according to the foregoing exemplary embodiments in the present disclosure may be applied to various type semiconductor light emitting devices via positive characteristics.

Figure 12:
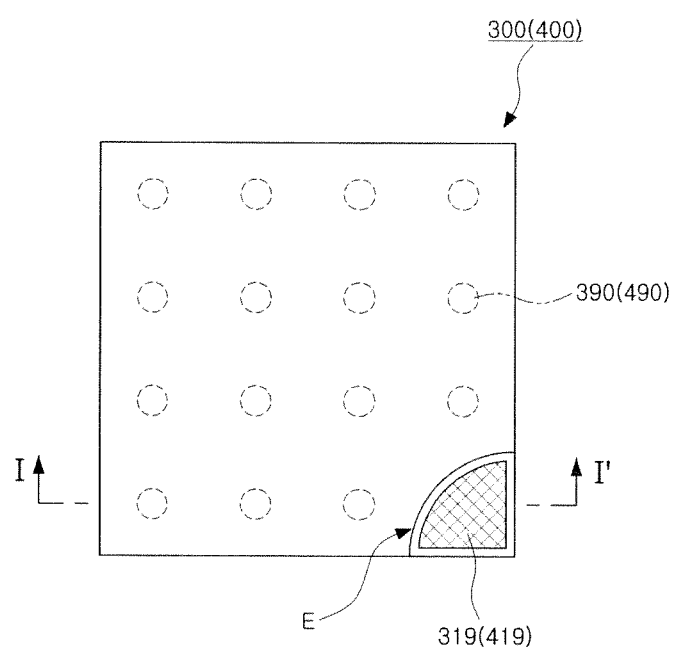
FIG. 12 is a plan view of a semiconductor light emitting device according to an exemplary embodiment in the present disclosure.
Figure 13:
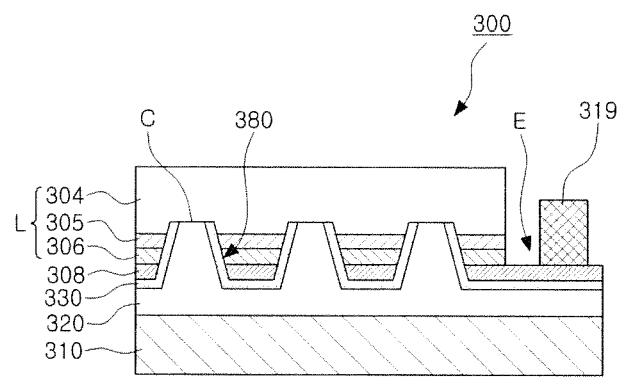
FIGS. 13 and 14 are cross-sectional views of a semiconductor light emitting device according to another exemplary embodiment in the present disclosure.
Figure 14:
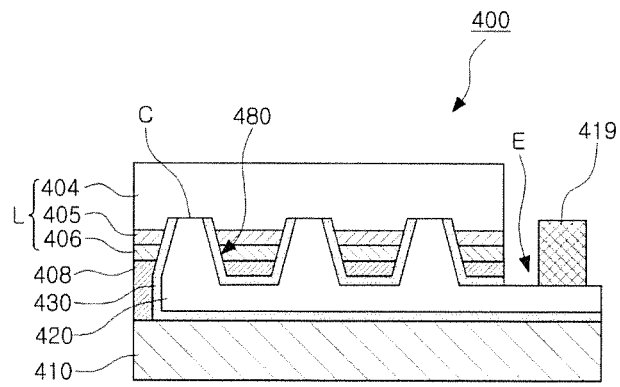

FIG. 12 is a plan view of a semiconductor light emitting device according to an exemplary embodiment in the present disclosure. FIGS. 13 and 14 are cross-sectional views of the semiconductor light emitting device, taken along line I-I' of FIG. 12.

First, with reference to FIGS. 12 and 13, a nitride semiconductor light emitting device 300 according to an exemplary embodiment in the present disclosure may include a conductive substrate 310, a first electrode 308, an insulating layer 330, a second electrode 320, a second conductivity type nitride semiconductor layer 306, an active layer 305, and a first conductivity type nitride semiconductor layer 304, which are sequentially stacked to be included therein. The first and second conductivity type semiconductor layers 304 and 306 may be provided as an n-type nitride semiconductor layer and a p-type nitride semiconductor layer, respectively.

The active layer 305 may have a multiple quantum well (MQW) structure in which a quantum well layer and a quantum barrier layer are alternately stacked. In the case of the active layer 305, as illustrated in the foregoing exemplary embodiments of the present disclosure described above, a first quantum barrier layer adjacent to the first conductivity type semiconductor layer 304 may be grown at a relatively high temperature, and a second quantum barrier layer adjacent to the second conductivity type semiconductor layer 306 may be grown at a relatively low temperature. For example, the active layer 305 may be provided as a nitride semiconductor layer such as a GaN/InGaN layer. As such, in the case that the quantum well layer contains indium, a quantum well layer adjacent to the first quantum barrier layer may have an indium composition ratio lower than that of a quantum well layer adjacent to the second quantum barrier layer.

The conductive substrate 310 may be a semiconductor substrate or a metal substrate having electrical conductivity. For example, the conductive substrate 310 may be a metal substrate containing one of Au, Ni, Cu and W or may be a semiconductor substrate containing one of Si, Ge and GaAs.

The first electrode 308 may be disposed on the conductive substrate 310, and the first electrode 308 may be disposed to be connected to the second conductivity type nitride semiconductor layer 306. A nitride laminate L may include a contact hole 380 formed therein, penetrating through the first electrode 308, the second conductivity type nitride semiconductor layer 306 and the active layer 305 to be extended to a predetermined region of the first conductivity type nitride semiconductor layer 304. A portion of a region of the second electrode 320 may be connected to the insulating layer 330 and the first conductivity type nitride semiconductor layer 304 via the contact hole 380. Thus, the conductive substrate 310 and the first conductivity type nitride semiconductor layer 304 may be electrically connected to each other.

The insulating layer 330 may be provided on the first electrode 308 such that the second electrode 320 may be electrically insulated from other regions except for the conductive substrate 310 and the first conductivity type nitride semiconductor layer 304. As illustrated in FIG. 13, the insulating layer 330 may be formed on a side of the contact hole 380 as well as being formed between the first electrode 308 and the second electrode 320. Thus, the first electrode 380, the second conductivity type nitride semiconductor layer 306, and the active layer 305 exposed to a side of the contact hole 380 may be insulated from the second electrode 320.

A contact region C of the first conductivity type nitride semiconductor layer 304 may be exposed to the contact hole 380, and a portion of a region of the second electrode 320 may be formed to contact the contact region C via the contact hole 380. Thus, the second electrode 320 may be connected to the first conductivity type nitride semiconductor layer 304.

The first electrode 308 may provide an electrode formation region E extended outwardly of the nitride laminate L to be exposed externally as illustrated in FIG. 13. The electrode formation region E may include an electrode pad portion 319 connecting the first electrode 308 to an external power source. Although the electrode formation region E has been illustrated as being a single region, a plurality of electrode formation regions may be provided therein. The electrode formation region E may be formed in one corner of the nitride semiconductor light emitting device 300 to significantly increase alight emission area as illustrated in FIG. 13. The first electrode 308 may be formed using a material having relatively high reflectivity while forming an ohmic contact with the second conductivity type nitride semiconductor layer 306. As a material of the first electrode 308, the reflective electrode material described above as an example above may be used.

In a manner different from the case of the nitride light emitting device 300 illustrated in FIG. 13, in the case of a nitride semiconductor light emitting device 400 of FIG. 14, a second electrode 420 connected to a first conductivity type nitride semiconductor layer 404 may be exposed externally.

The semiconductor light emitting device 400 illustrated in FIG. 14 may include a conductive substrate 410, and a nitride laminate L disposed above the conductive substrate and including a second conductivity type nitride semiconductor layer 406, an active layer 405, and a first conductivity type nitride semiconductor layer 404, in a manner similar to the foregoing exemplary embodiment in the present disclosure. A first electrode 408 may be disposed between the second conductivity type nitride semiconductor layer 406 and the conductive substrate 410. The nitride laminate L may have a contact hole 480 formed therein. A contact region C of the first conductivity type nitride semiconductor layer 404 may be exposed to the contact hole, and the contact region C may be connected to a portion of a region of the second electrode 420. The second electrode 420 may be electrically isolated from the active layer 405, the second conductivity type nitride semiconductor layer 406, the first electrode 408 and the conductive substrate 410 by an insulating layer 430.

However, in a manner different therefrom, an electrode formation region E in which the second electrode 420 is extended and exposed externally may be provided, and an electrode pad portion 419 may be disposed on an upper portion of the electrode formation region E. In addition, the first electrode 408 may be directly connected to the conductive substrate 410 so that the conductive substrate 410 may be provided as an electrode connected to the second conductivity type nitride semiconductor layer 406.

Figure 15:
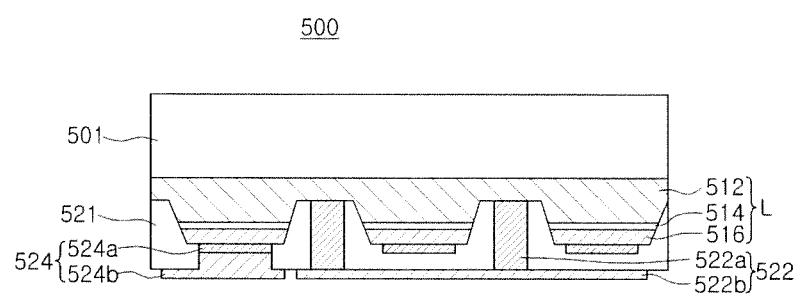
FIG. 15 is a side cross-sectional view of a semiconductor light emitting device according to an exemplary embodiment in the present disclosure.

FIG. 15 is a side cross-sectional view of a semiconductor light emitting device according to an exemplary embodiment in the present disclosure.

A semiconductor light emitting device 500 illustrated in FIG. 15 may include a semiconductor laminate L formed on a substrate 501. The semiconductor laminate L may include a first conductivity type semiconductor layer 512, an active layer 514, and a second conductivity type semiconductor layer 516.

The active layer 514 may have a multiple quantum well (MQW) structure in which a quantum well layer and a quantum barrier layer are alternately stacked. In the case of the active layer 514, as illustrated in the foregoing exemplary embodiments of the present disclosure described above, a first quantum barrier layer adjacent to the first conductivity type semiconductor layer 512 may be grown at a relatively high temperature, and a second quantum barrier layer adjacent to the second conductivity type semiconductor layer 516 may be grown at a relatively low temperature. For example, the active layer 305 may be provided as a nitride semiconductor layer such as a GaN/InGaN layer. As such, in the case that the quantum well layer contains indium, a quantum well layer adjacent to the first quantum barrier layer may have an indium composition ratio lower than that of a quantum well layer adjacent to the second quantum barrier layer.

The semiconductor light emitting device 500 may include a first electrode 522 and a second electrode 524 respectively connected to the first and second conductivity type semiconductor layers 512 and 516. The first electrode 522 may include a conductive via 522a penetrating through the second conductivity type semiconductor layer 516 and the active layer 514 to be connected to the first conductivity type semiconductor layer 512, and a first electrode pad 522b connected to the conductive via 522a. The conductive via 522a may be encompassed by an insulating layer 521 to be electrically insulated from the active layer 514 and the second conductivity type semiconductor layer 516. The conductive via 522a may be disposed in an etched region of the semiconductor laminate L. The second electrode 524 may include an ohmic contact layer 524a disposed on the second conductivity type semiconductor layer 516 and a second electrode pad 524b.

In the case of the conductive via 522a employed in the exemplary embodiment of the present disclosure, the number, shape and pitch thereof, and/or a contact area thereof with the first conductivity type semiconductor layer 512, and the like, may be appropriately designed to reduce contact resistance. In addition, the conductive vias 522a may be arranged in rows and columns on the semiconductor laminate L.

A semiconductor light emitting device according to exemplary embodiments in the present disclosure may be implemented as variously applied products.

Figure 16:
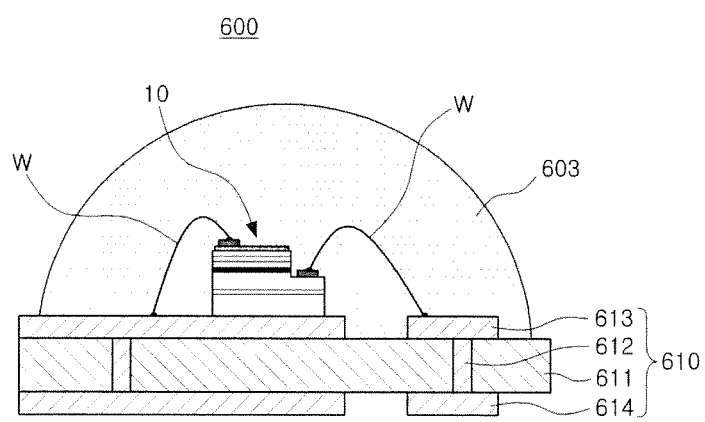
FIG. 16 is a cross-sectional view of a package in which a semiconductor light emitting device illustrated in FIG. 1 is employed.

FIG. 16 is a cross-sectional view of a package in which a semiconductor light emitting device of FIG. 1 is employed.

A semiconductor light emitting device package 600 illustrated in FIG. 16 may include a semiconductor light emitting device 10 illustrated in FIG. 1, a mounting substrate 610, and an encapsulation portion 603. The semiconductor light emitting device 10 may be disposed on the mounting substrate 610 to be electrically connected thereto via a wire W. The mounting substrate 610 may include a substrate body 611, an upper electrode 613, a lower electrode 614, and a through electrode 612 connecting the upper electrode 613 to the lower electrode 614. The mounting substrate 610 may be provided as a substrate such as a printed circuit board (PCB), a metal-core printed circuit board (MCPCB), MPCB, a flexible printed circuit board (FPCB), or the like, and the structure of the mounting substrate 610 may be variously applied.

The encapsulation portion 603 may have a dorm-shaped lens structure having a convex upper surface. In addition, according to an exemplary embodiment in the present disclosure, the surface of the encapsulation portion 603 may be a convex or concave shaped lens structure, so as to be able to adjust an angle of beam spread in light emitted through the upper surface of the encapsulation portion 603.

Figure 17:
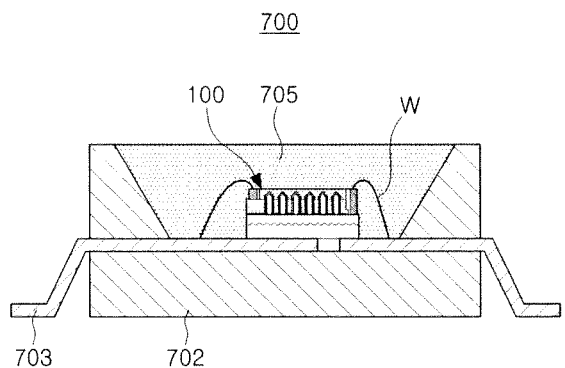
FIG. 17 is a cross-sectional view of a package in which a nanostructure semiconductor light emitting device illustrated in FIG. 9 is employed.

FIG. 17 is a cross-sectional view of a package in which a nanostructure semiconductor light emitting device of FIG. 9 is employed.

A semiconductor light emitting device package 700 illustrated in FIG. 17 may include the nanostructure semiconductor light emitting device 100 illustrated with reference to FIG. 9, a package body 702, and a pair of lead frames 703.

The nanostructure semiconductor light emitting device 100 may be mounted on the lead frame 703 such that respective electrodes are electrically connected to the lead frame 703 through a wire W. The nanostructure semiconductor light emitting device 100 may be mounted in other regions instead of the lead frame 703, for example, in the package body 702 as necessary. In addition, the package body 702 may have a cut shaped recess portion formed therein to improve light reflection efficiency. An encapsulation portion 705 formed of a light emitting material may be formed in such a recess portion to encapsulate the nanostructure semiconductor light emitting device 100, the wire W, and the like.

The encapsulation portions 603 and 705 may contain a wavelength conversion material such as a phosphor and/or a quantum dot. The wavelength conversion material will be described in detail below.

Figure 18:
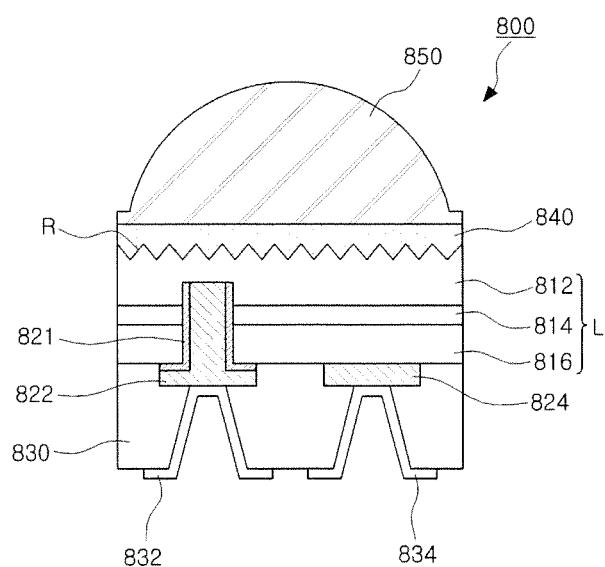
FIG. 18 is a cross-sectional view of a semiconductor light emitting device package according to an exemplary embodiment in the present disclosure.

FIG. 18 is a cross-sectional view of a package in which a semiconductor light emitting device according to an exemplary embodiment in the present disclosure is employed. The package according to the exemplary embodiment in the present disclosure may be a chip scale package (CSP) manufactured in a compact chip size.

With reference to FIG. 18, a semiconductor light emitting device package 800 according to an exemplary embodiment in the present disclosure may include a support body 830 containing first and second external electrodes 832 and 834, and a semiconductor laminate L disposed on the support body 830. The support body 830 may have an area corresponding to that of the semiconductor laminate L.

The semiconductor laminate L may include a first conductivity type semiconductor layer 812 and a second conductivity type semiconductor layer 816, and an active layer 814 interposed therebetween. The first and second conductivity type semiconductor layers 812 and 816 configuring the semiconductor laminate L may be a p-type semiconductor layer and an n-type semiconductor layer, respectively. For example, the first conductivity type semiconductor layer 812 may be provided as an n-type GaN layer. The second conductivity type semiconductor layer 816 may be provided as a p-type AlGaN/p-type GaN layer.

The active layer 814 may have a multiple quantum well (MQW) structure in which a quantum well layer and a quantum barrier layer are alternately stacked. In the case of the active layer 814, as illustrated in the foregoing exemplary embodiments of the present disclosure described above, a first quantum barrier layer adjacent to the first conductivity type semiconductor layer 812 may be grown at a relatively high temperature, and a second quantum barrier layer adjacent to the second conductivity type semiconductor layer 816 may be grown at a relatively low temperature. For example, the active layer 814 may be provided as a nitride semiconductor layer such as a GaN/InGaN layer. As such, in the case that the quantum well layer contains indium, a quantum well layer adjacent to the first quantum barrier layer may have an indium composition ratio lower than that of a quantum well layer adjacent to the second quantum barrier layer.

The semiconductor laminate L may include first and second electrodes 822 and 824 respectively connected to the first and second conductivity type semiconductor layers 812 and 816. The first electrode 822 may penetrate through the second conductivity type semiconductor layer 816 and the active layer 814 to be connected to the first conductivity type semiconductor layer 812. The first electrode 822 may be electrically insulated from the second conductivity type semiconductor layer 816 and the active layer 814 by an insulating layer 821. The first and second electrodes 822 and 824 may be connected to first and second external electrodes 832 and 834 provided on the support body 830.

The semiconductor light emitting device package 800 may include a wavelength conversion layer 840 converting a wavelength of light emitted from the active layer 814, and a lens portion 850 disposed on the wavelength conversion layer 840. A surface of the semiconductor laminate L on which the wavelength conversion layer 840 is formed may have a concave-convex portion R formed thereon to improve light extraction efficiency.

A side of the semiconductor laminate L (here, a surface of a passivation layer may be applied in a case in which the passivation layer is applied to the side thereof) may have a substantially flat surface coplanar with a side of the support body 830. Such a flat coplanar surface may be obtained via a cutting process.

A wavelength conversion material such as a phosphor, a quantum dot, or the like may be contained in the interior of the encapsulation portion 603 or 705, on a surface of the semiconductor light emitting device 10 or 100, or in a separate wavelength conversion layer 840 according to the foregoing exemplary embodiments in the present disclosure. Such a phosphor or quantum dot may be appropriately selected and used according to light characteristics of a semiconductor light emitting device.

For example, the wavelength conversion material may contain, for example, at least one or more phosphors excited by light generated in the semiconductor light emitting device 10 or 100 to thus emit light having a different wavelength, so that light having various colors as well as white light may be emitted.

For example, when the semiconductor light emitting device 10 or 100 may emit blue light, the light emitting device package 600 or 700 containing one or more of yellow, green and red phosphors may emit white light having various color temperatures according to a combination ratio of phosphors. For example, a color temperature and a color rendering index (CRI) of the white light may be controlled by additionally combining a green phosphor and/or a red phosphor to a yellow phosphor.

Figure 19:
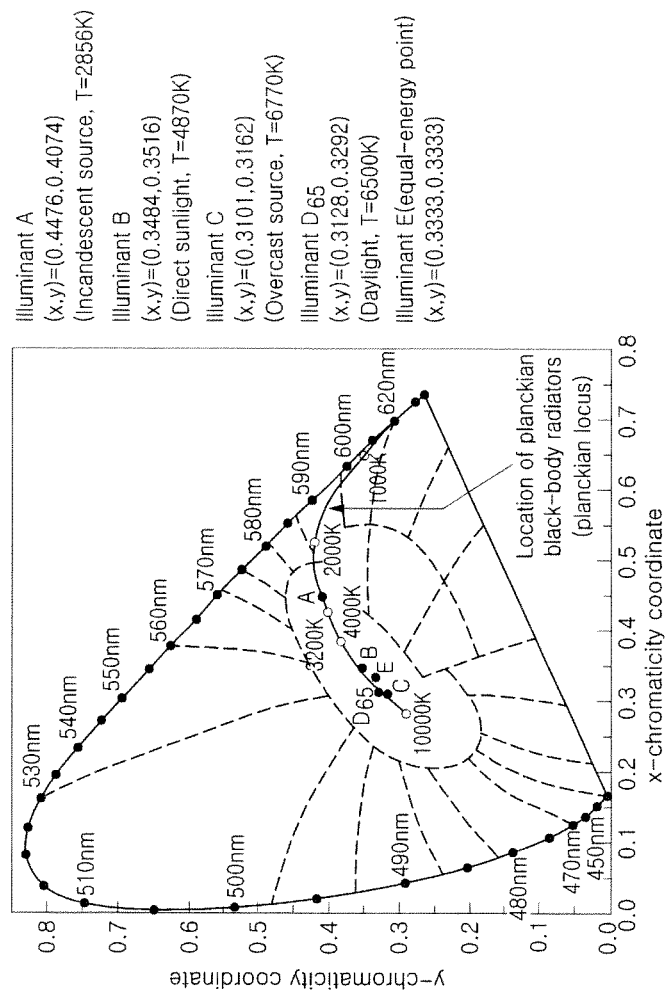
FIG. 19 illustrates a CIE 1931 coordinate system for explanation of a wavelength conversion material that may be employed in an exemplary embodiment of the present disclosure.

Referring to a CIE 1931 chromaticity coordinate system illustrated in FIG. 19, white light obtained by combining yellow, green and red phosphors or green and red LEDs with a UV or blue LED may have two or more peak wavelengths, and a coordinate (x, y) of the CIE 1931 chromaticity coordinate system illustrated in FIG. 19 may be located on line segments (0.4476, 0.4074), (0.3484, 0.3516), (0.3101, 0.3162), (0.3128, 0.3292), and (0.3333, 0.3333) connected to one another. Alternatively, the coordinates (x, y) may be located in a region encompassed by the line segments and black body radiation spectrum. A color temperature of the white light may be in a range of 2000K to 20000K.

A wavelength conversion material applicable to the foregoing exemplary embodiments in the present disclosure may contain phosphors represented by the following empirical formulae.

Oxide-based Phosphor: Yellow and green $Y_3Al_5O_{12}$:Ce, $Tb_3Al_5O_{12}$:Ce, $Lu_3Al_5O_{12}$:Ce Silicate-based Phosphor: Yellow and green $(Ba,Sr)_2SiO_4$:Eu, Yellow and yellowish-orange $(Ba,Sr)_3SiO_5$:Ce, $Ca_{1.2}Eu_{0.8}SiO_4$ corresponding to red $Ca_2SiO_4$:Eu Nitride-based Phosphor: Green β-SiAlON:Eu, yellow $La_3Si_6N_{11}$:Ce, yellowish-orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ (0.5≤x≤3, 0<z<0.3, 0<y≤4) (Here, Ln may be at least one element selected from a group consisting of group IIIa elements and rare-earth elements, and M may be at least one element selected from a group consisting of Ca, Ba, Sr and Mg)

Fluoride-based Phosphor: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$ A composition of the phosphors should basically coincide with stoichiometry, and respective elements may be substituted with other elements in respective groups of the periodic table of elements. For example, Sr may be substituted with Ba, Ca, Mg, or the like, of an alkaline earth group II, and Y may be substituted with lanthanum-based Tb, Lu, Sc, Gd, or the like. In addition, Eu or the like, an activator, may be substituted with Ce, Tb, Pr, Er, Yb, or the like, according to a required level of energy, and an activator alone or a sub-activator or the like for modification of characteristics thereof may additionally be used.

In addition, as a phosphor substitute, materials such as a quantum dot (QD) or the like may be used, and a phosphor and a quantum dot alone, or a mixture thereof, may be used. The quantum dot may be configured in a structure including a core (3 to 10 nm) formed using CdSe, InP, or the like, a shell (0.5 to 2 nm) formed using ZnS, ZnSe, or the like, and a ligand for stabilization of the core and the shell, and may implement various colors depending on the size thereof.

The following table 1 illustrates phosphor types of white light emitting device packages using a UV light emitting device chip (200 to 440 nm) or a blue light emitting device chip (440 to 480 nm), for respective application fields.

TABLE 1

| Use | Phosphor |
| --- | --- |
| LED TV BLU | β-SiAlON:$Eu^{2+}$, (Ca, Sr)AlSiN$_3$:$Eu^{2+}$, $La_3Si_6N_{11}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$ $Ca_2SiO_4$:$Eu^{2+}$, $Ca_{1.2}Eu_{0.8}SiO_4$ |
| Illumination | $Lu_3Al_5O_{12}$:$Ce^{3+}$, Ca-α-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $Ca_2SiO_4$:$Eu^{2+}$, $Ca_{1.2}Eu_{0.8}SiO_4$ |
| Side Viewing (Mobile Phones, Notebook PCs, etc) | $Lu_3Al_5O_{12}$:$Ce^{3+}$, Ca-α-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, (Sr, Ba, Ca, Mg)$_2SiO_4$:$Eu^{2+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $Ca_2SiO_4$:$Eu^{2+}$, $Ca_{1.2}Eu_{0.8}SiO_4$ |
| Vehicle Headlights (Head Lamps, Parking lights etc.) | $Lu_3Al_5O_{12}$:$Ce^{3+}$, Ca-α-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$(0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$, $Ca_2SiO_4$:$Eu^{2+}$, $Ca_{1.2}Eu_{0.8}SiO_4$ |

A color temperature appropriate for an ambient atmosphere may be obtained by selectively combining violet, blue, green, red, orange, or the like with a white light emitting device package as needed. For example, a white light emitting device package having a color temperature of 4000K, a white light emitting device package having a color temperature of 3000K, and a red light emitting device package may be disposed within a single module, and the respective packages may then be driven independently of each other to control an output therefrom, so that a color temperature thereof may be adjusted to be within a range of 2000K to 4000K. In addition, a white light emitting module having a color rendering index (Ra) of 85 to 99 may be manufactured.

In another example, a white light emitting device package having a color temperature of 5000K and a white light emitting device package having a color temperature of 2700K may be disposed within a single module, and the respective packages may then be driven independently of each other to control a respective output, so that a color temperature thereof may be adjusted to be within a range of 2700K to 5000K. In addition, a white light emitting module having a color rendering index (Ra) of 85 to 99 may be manufactured.

The number of light emitting device packages may be changed according to a basic color temperature setting value. For example, when the basic color temperature setting value approximates about 4000K, the number of light emitting device packages having a color temperature of 4000K may be more than the number of light emitting device packages having a color temperature of 3000K or the number of red light emitting device packages.

Figure 22:
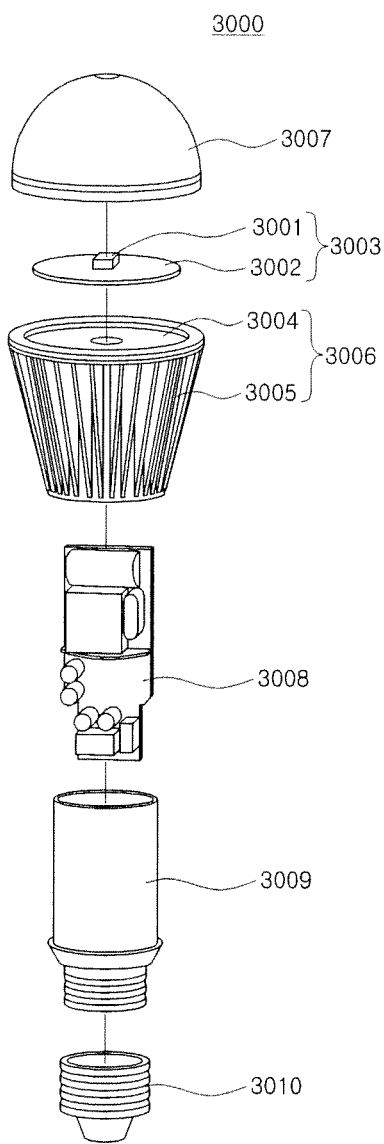
FIG. 22 is an exploded perspective view illustrating an example of a lighting device in which a semiconductor light emitting device or a light emitting device package according to an exemplary embodiment in the present disclosure is employed.

As such, a module of which a color rendering index and a color temperature are adjustable may be used in a lighting device as illustrated in FIG. 22 via positive attributes thereof, and the semiconductor light emitting devices according to the exemplary embodiments in the present disclosure and packages having the same may be applied to various products via positive attributes thereof.

Figure 20:
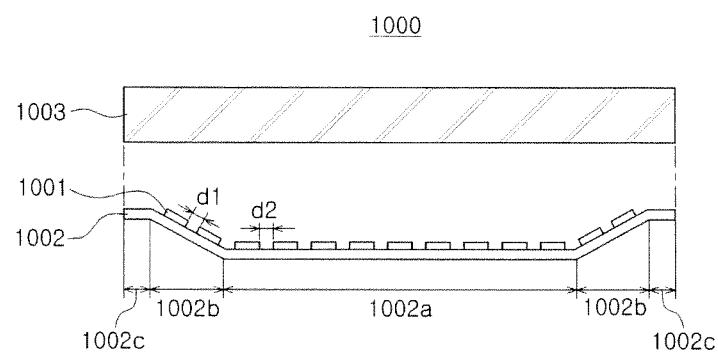
FIGS. 20 and 21 illustrate examples of backlight units in which a semiconductor light emitting device or a light emitting device package according to an exemplary embodiment in the present disclosure may be employed.
Figure 21:
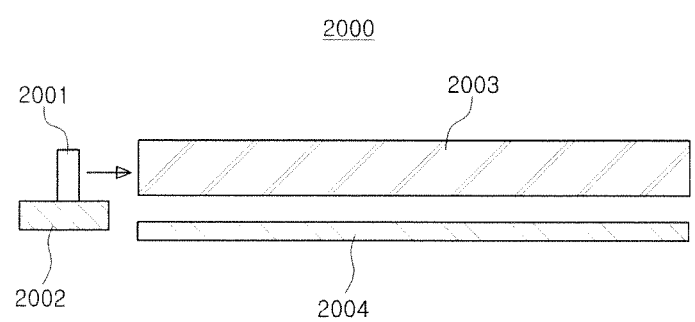

FIGS. 20 and 21 illustrate examples of backlight units in which a semiconductor light emitting device package according to an embodiment in the present disclosure is employed.

With reference to FIG. 20, a back light unit 1000 may include light sources 1001 mounted on a circuit board 1002 and one or more optical sheets 1003 disposed thereabove. As the light source 1001, the semiconductor light emitting device described above according to the exemplary embodiments in the present disclosure or a package having the same may be used.

The light sources 1001 may be arranged on the circuit board 1002. The circuit board 1002 employed in the exemplary embodiment of the present disclosure may have a first flat portion 1002a corresponding to a main region thereof, an inclined portion 1002b adjacent thereto, formed in a manner in which at least a portion thereof is bent, and a second flat portion 1002c provided as an outer side of the inclined portion 1002b and disposed in an edge portion of the circuit board 1002. On the first flat portion 1002a, the light sources may be arranged to have a second interval d2 therebetween, and on the inclined portion 1002b, one or more light sources 1001 may be arranged to have a first interval d1 therebetween. The first interval d1 may be equal to the second interval d2. A width, in detail, a length thereof in a cross section, of the inclined portion 1002b may be less than a width of the first flat portion 1002a and may be greater than that of the second flat portion 1002c. In addition, at least one light source may also be disposed on the second flat portion 102c as needed.

An inclination of the inclined portion 1002b may be appropriately adjusted in a range greater than 0 degree and less than 90 degrees, based on the first flat portion 1002a. As the circuit board 1002 has such a structure, brightness may also be uniformly maintained in the vicinity of an edge of the optical sheet 1003.

In a manner different from that of the backlight unit 1000 of FIG. 20 in which the light sources 1001 emit light upwardly in a direction in which a liquid crystal display device is disposed, in the case of a backlight unit 2000 of another example illustrated in FIG. 21, a light source 2001 mounted on a substrate 2002 emits light in a lateral direction such that the emitted light may be incident onto a light guiding panel 2003 to be converted into a form of surface light source type light. Light passing through the light guiding panel 2003 may be discharged in an upward direction, and a reflective layer 2004 may be disposed below the light guiding panel 2003 to improve light extraction efficiency.

FIG. 22 is an exploded perspective view illustrating an example of a lighting device in which a semiconductor light emitting device according to an exemplary embodiment in the present disclosure is employed.

A lighting device 3000 illustrated in FIG. 22 may be a bulb type lamp byway of example. The lighting device 3000 may include a light emitting module 3003, a driving unit 3008, and an external connection unit 3010. In addition, the lighting device 3000 may further include a structure of appearance such as external and internal housings 3006 and 3009 and a cover unit 3007.

The light emitting module 3003 may include a light source 3001 that may be provided as the semiconductor light emitting device described above according to the exemplary embodiment in the present disclosure or a package including the same, and a circuit board 3002 on which the light source is mounted. For example, the first and second electrodes of the semiconductor light emitting device may be electrically connected to an electrode pattern of the circuit board 3002. Although the exemplary embodiment of the present disclosure illustrates the case in which one light source 3001 is mounted on the circuit board 3002, a plurality of light sources may be mounted as needed.

The external housing 3006 may serve as a heat emission part and may include a heat emission plate 3004 directly contacting the light emitting module 3003 to improve a heat emission effect, and heat radiating fins 3005 surrounding a circumferential surface of the lighting device 3000. The cover unit 3007 may be mounted on the light emitting module 3003 and may have a convex lens shape. The driving unit 3008 may be mounted in the internal housing 3009 to be connected to the external connection unit 3010 having a structure such as a socket structure to receive power from an external power source.

In addition, the driving unit 3008 may serve to convert the received power into a current source appropriate for driving the semiconductor light emitting device, for example, the light source 3001 of the light emitting module 3003, to then provide the converted current. For example, the driving unit 3008 may be configured of an alternating current to direct current (AC to DC) converter, a rectifying circuit component, and the like.

Figure 23:
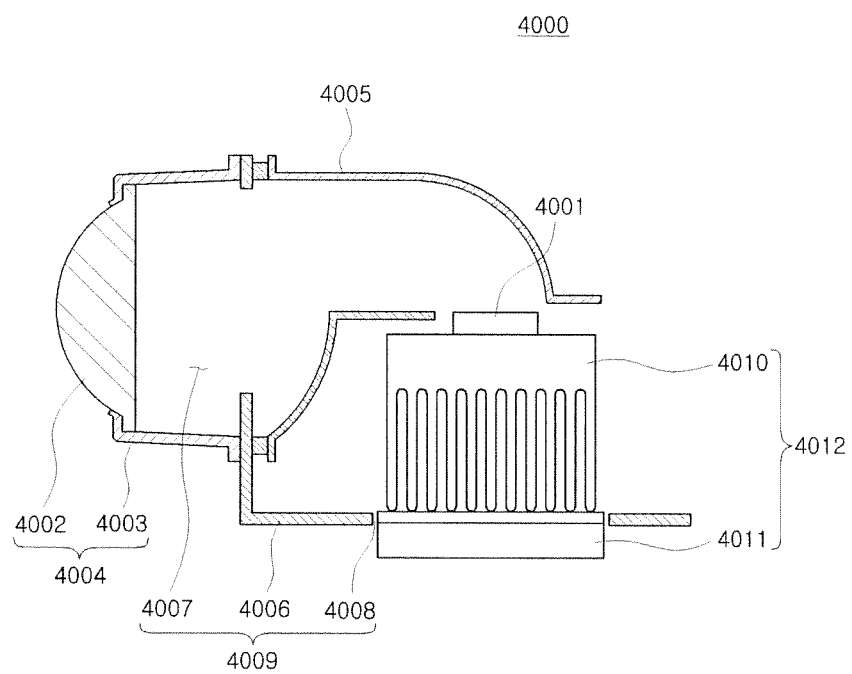
FIG. 23 illustrates an example of a headlamp in which a semiconductor light emitting device or a light emitting device package according to an exemplary embodiment in the present disclosure is applied.

FIG. 23 illustrates an example in which a semiconductor light emitting device according to an exemplary embodiment in the present disclosure is applied to a headlamp.

With reference to FIG. 23, a headlamp 4000 for vehicle lighting or the like may include a light source 4001, a reflective unit 4005, and a lens cover unit 4004. The lens cover unit 4004 may include a hollow guide 4003 and a lens 4002. The light source 4001 may include the semiconductor light emitting device according to the exemplary embodiment in the present disclosure or a package having the semiconductor light emitting device.

The headlamp 4000 may further include a heat radiating unit 4012 discharging heat generated in the light source 4001 to the outside. The heat radiating unit 4012 may include a heat sink 4010 and a cooling fan 4011 to perform effective heat emissions. In addition, the headlamp 4000 may further include a housing 4009 fixing and supporting the heat radiating unit 4012 and the reflective unit 4005, and the housing 4009 may have a body 4006 including a central hole 4008 in one surface thereof, to facilitate coupling of the heat radiating unit 4012 thereto and mounting thereof.

The housing 4009 may have a front hole 4007 in the other surface integrally connected to the one surface to then be bent in a direction orthogonal thereto, through which the reflective unit 4005 is fixed to be disposed over the light source 4001. Whereby, the front side thereof may be open by the reflective unit 4005, and the reflective unit 4005 may be fixed to the housing 4009 such that the open front side corresponds to the front hole 4007, such that light reflected through the reflective unit 4005 may pass through the front hole 4007 to be then emitted externally.

According to exemplary embodiments in the present disclosure, during growth of an active layer, a barrier layer may be grown at a relatively high temperature in a first growth region corresponding to initial growth thereof, and the barrier layer may be grown at a relatively low temperature in a second growth region of the active layer, corresponding to latter growth thereof, principally contributing to the emission of light. Whereby, thermal damage to a quantum well layer actually contributing to the emission of light may be significantly reduced while enhancing crystalline properties within the active layer (a first growth region), and thus, light emission efficiency may be enhanced.

In detail, thermal damage to a quantum well layer may be significantly reduced while preventing a crystal defect, for example, a dot defect occurring due to growth of a barrier layer at a relatively high temperature and improving surface roughness by intentionally decreasing an indium composition ratio of a quantum well layer located in a first growth region, thereby enhancing light emission.

While embodiments have been shown and described above, it will be apparent to those skilled in the art that modifications and variations could be made without departing from the scope of the present disclosure as defined by the appended claims.

What is claimed is:

1. A method of fabricating a semiconductor light emitting device, comprising:
   forming a first conductivity type nitride semiconductor layer;
   forming an active layer on the first conductivity type nitride semiconductor layer; and
   forming a second conductivity type nitride semiconductor layer on the active layer,
   wherein the active layer has a structure in which a plurality of quantum barrier layers and a plurality of quantum well layers containing indium are alternately stacked,
   the plurality of quantum barrier layers and the plurality of quantum well layers are divided into a plurality of groups according to a growth direction, and the plurality of groups respectively have at least one quantum barrier layer and at least one quantum well layer and include a first group adjacent to the first conductivity type nitride semiconductor layer and a second group adjacent to the second conductivity type nitride semiconductor layer, and a quantum barrier layer of the first group is grown at a temperature higher than a growth temperature of a quantum barrier layer of the second group, a quantum well layer of the first group having an indium composition ratio lower than that of a quantum well layer of the second group.

2. The method of claim 1, wherein the plurality of groups comprise a third group disposed between the first group and the second group, and a quantum barrier layer of the third group is grown at a temperature different from those of quantum barrier layers of the first and second groups.

3. The method of claim 2, wherein the quantum barrier layer of the third group is grown at a temperature lower than a growth temperature of the quantum barrier layer of the first group and higher than a growth temperature of the quantum barrier layer of the second group.

4. The method of claim 3, wherein a quantum well layer of the third group has an indium composition ratio higher than that of a quantum well layer of the first group and lower than that of a quantum well layer of the second group.

\* \* \* \* \*